United States Patent
Cao et al.

(10) Patent No.: US 11,923,254 B2
(45) Date of Patent: Mar. 5, 2024

(54) METHOD FOR DETECTING TEMPERATURE OF THERMAL CHAMBER

(71) Applicant: Zing Semiconductor Corporation, Shanghai (CN)

(72) Inventors: Gongbai Cao, Shanghai (CN); Liying Liu, Shanghai (CN); Chihhsin Lin, Shanghai (CN); Dengyong Yu, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 493 days.

(21) Appl. No.: 17/162,255

(22) Filed: Jan. 29, 2021

(65) Prior Publication Data

US 2022/0115274 A1   Apr. 14, 2022

(30) Foreign Application Priority Data

Oct. 9, 2020   (CN) ......................... 202011075003.3

(51) Int. Cl.
*H01L 21/66* (2006.01)
*G01K 3/10* (2006.01)
*G01K 11/00* (2006.01)

(52) U.S. Cl.
CPC ............... *H01L 22/12* (2013.01); *G01K 3/10* (2013.01); *G01K 11/00* (2013.01)

(58) Field of Classification Search
None
See application file for complete search history.

(56) References Cited

U.S. PATENT DOCUMENTS

2022/0115274 A1* 4/2022 Cao .......................... G01K 3/10

FOREIGN PATENT DOCUMENTS

CN   109238510 A   1/2019

* cited by examiner

*Primary Examiner* — Jack S Chen
(74) *Attorney, Agent, or Firm* — Chen Yoshimura LLP

(57) ABSTRACT

The present application provides a method for detecting temperature of thermal chamber comprising: conducting a thermal treatment at a predicted temperature to a selected silicon wafer within a thermal chamber, wherein the predicted temperature comprises plural temperature points set in order; obtaining a haze value corresponding to the predicted temperature; obtaining a linear relationship I between the temperature and the haze; polishing and washing the silicon wafer; conducting a thermal treatment at a predicted temperature to the polished silicon wafer within the thermal chamber; obtaining a linear relationship II between the temperature and the haze; calculating a difference of the haze at same temperature point between the two thermal treatments, and obtaining an actual temperature difference of the thermal chamber based on the difference of the haze. The present application increases efficiency and accuracy of temperature detection of the thermal chamber, reduce fluctuations caused by silicon wafer thickness and resistivity, increase utilization of silicon wafer, and reduce cost.

7 Claims, 4 Drawing Sheets

METHOD FOR DETECTING TEMPERATURE OF THERMAL CHAMBER

BACKGROUND OF THE INVENTION

1. Field of the Invention

The present invention relates to temperature measurement of thermal chamber, and more particularly to the temperature detection of thermal chamber.

2. Description of the Related Art

In semiconductor manufacture, the temperature in the thermal chamber cannot be monitored accurately because of limitations for principles or properties of the sensor.

Conventional types of temperature sensors for high temperature include infrared pyrometer and thermocouple. Both types fail to maintain stability and consistence for long-term use due to the inspection standard deviation in the manufacture detection. Further, during the operation, installation and maintenance of the thermal chamber, the temperature shown by the sensor may be inconsistent with the actual temperature in the thermal chamber because of the installation and calibration of the sensor.

During the operation of the thermal chamber, the difference between the temperature shown by the sensor and the actual temperature in the thermal chamber is also affected by the internal states of the thermal chamber such as the lifetime of lamp or heater, the roughness change of the chamber wall and the like.

Therefore, there is a need for a method that can accurately monitor the temperature change in the thermal chamber and the temperature difference between different thermal chambers.

SUMMARY

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

The present application describes a method for detecting temperature of a thermal chamber comprising:

Step S1: conducting a thermal treatment at a predicted temperature to a selected silicon wafer within the thermal chamber, wherein the predicted temperature comprises plural temperature points set in order; obtaining haze values corresponding to the predicted temperature points; obtaining a linear relationship I between the temperature of the thermal chamber and the haze of the wafer;

Step S2: polishing and washing the wafer;

Step S3: repeating the Step S1 to conduct the thermal treatment to the polished wafer within the thermal chamber; obtaining a linear relationship II between the temperature of the thermal chamber and the haze of the polished wafer; and Step S4: calculating a difference of the haze at the same temperature point between the Steps S1 and S3, and obtaining an actual temperature difference of the thermal chamber based on the difference of the haze.

Further, in the Step 4, the difference of the haze divided by a linear coefficient makes the actual temperature difference of the thermal chamber, wherein the linear coefficient is selected from that of the linear relationship I or the linear relationship II, provided that the coefficient of determination of the selected linear relationship more closes to 1.

Further, the predicted temperature comprises 1100° C.-1200° C.

Further, the plural temperature points set in order have an interval of 20° C.

Further, the haze of the wafer is detected by a particle measuring apparatus.

Further, the polishing comprises mechanical polishing or chemical polishing.

Further, the polishing removes a thickness of 0.1-0.5 μm from the wafer surface.

In other embodiments, the present application also provides a method for detecting temperature of a thermal chamber comprising:

Step S1: conducting a thermal treatment at a predicted temperature to a selected silicon wafer within a first thermal chamber, wherein the predicted temperature comprises plural temperature points set in order; obtaining haze values corresponding to the predicted temperature points; obtaining a linear relationship I between the temperature of the first thermal chamber and the haze of the wafer;

Step S2: polishing and washing the wafer;

Step S3: repeating the Step S1 to conduct the thermal treatment to the polished wafer within a second thermal chamber; obtaining a linear relationship II between the temperature of the second thermal chamber and the haze of the polished wafer; and Step S4: calculating a difference of the haze at the same temperature point between the Steps S1 and S3, and obtaining an actual temperature difference of the different thermal chambers based on the difference of the haze.

Further, in the Step 4, the difference of the haze divided by a linear coefficient makes the actual temperature difference of the different thermal chambers, wherein the linear coefficient is selected from that of the linear relationship I or the linear relationship II, provided that the coefficient of determination of the selected linear relationship more closes to 1.

Further, the predicted temperature comprises 1100° C.-1200° C.

Based on the method of the present application, the Haze difference of the wafer at same temperature point at different time is applied to detect the temperature of the thermal chamber. It increases efficiency and accuracy of temperature detection of the thermal chamber. Since the uncontrolled temperature difference occurs in the infrared pyrometer and the thermocouple to cause fluctuations of parameters such as wafer thickness and resistivity, the present application can reduce such fluctuations. Moreover, the test wafer can be used repeatedly, so that the present application is able to increase wafer utilization and reduce cost.

DETAILED DESCRIPTION OF THE EMBODIMENTS

Figure 1:
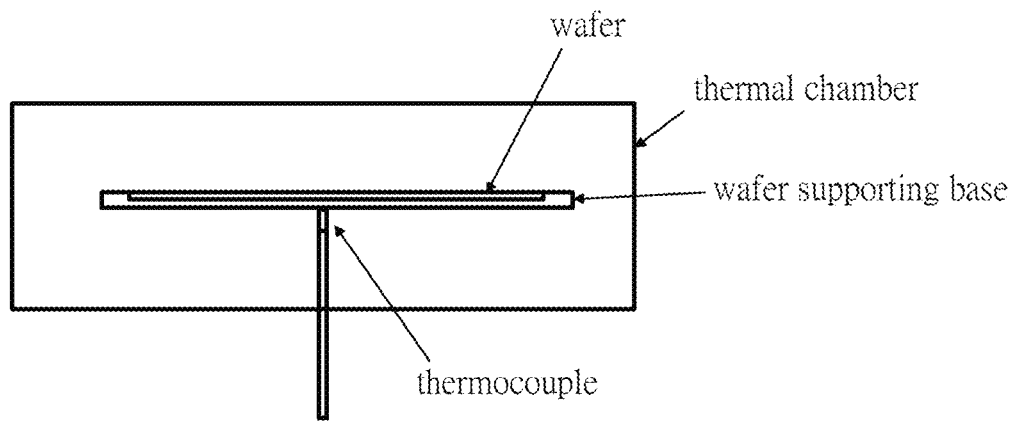
FIG. 1 shows, in prior art, a thermocouple is applied to detect temperature in a thermal chamber.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

Figure 2:
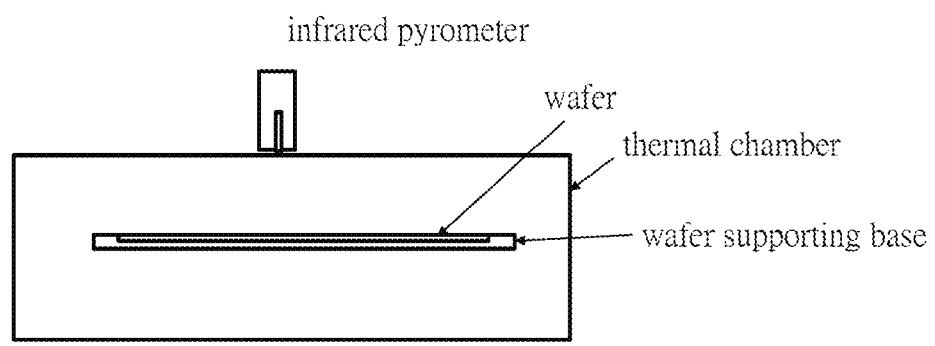
FIG. 2 shows, in prior art, an infrared pyrometer is applied to detect temperature in a thermal chamber.

Referring FIG. 1 and FIG. 2, the conventional method for monitoring the temperature in thermal chamber is described.

As shown in FIGS. 1 and 2, a wafer supporting base is disposed within the thermal chamber, and a wafer is disposed on the supporting base. The temperature in a thermal chamber is detected by the thermocouple in FIG. 1 and the infrared pyrometer in FIG. 2. Significant deviation between the actual temperature and the detected temperature exists in these two types of detection, causing nonuniform temperature distribution within the thermal chamber and abnormal process. Therefore, the present application provides a method for detecting temperature of a thermal chamber.

Example 1

Figure 3:
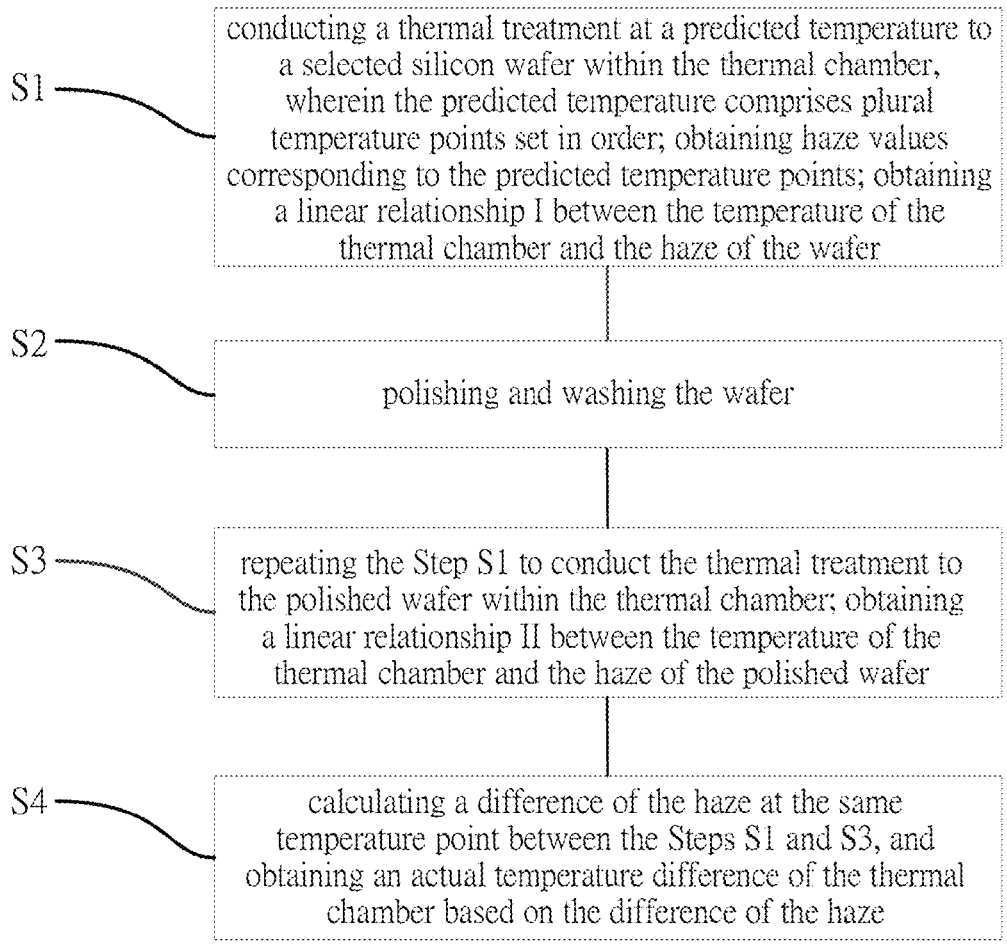
FIG. 3 shows, in accordance with one embodiment of the present application, a flowchart of the method for detecting temperature of a thermal chamber.

Referring FIG. 3 and FIG. 4, the method for detecting temperature of a thermal chamber is described as follows.

Step S1: conducting a thermal treatment at a predicted temperature to a selected silicon wafer within the thermal chamber, wherein the predicted temperature comprises plural temperature points set in order; obtaining haze values corresponding to the predicted temperature points; obtaining a linear relationship I between the temperature of the thermal chamber and the haze of the wafer.

Step S2: polishing and washing the wafer.

Step S3: repeating the Step S1 to conduct the thermal treatment to the polished wafer within the thermal chamber; obtaining a linear relationship II between the temperature of the thermal chamber and the haze of the polished wafer.

Step S4: calculating a difference of the haze at the same temperature point between the Steps S1 and S3, and obtaining an actual temperature difference of the thermal chamber based on the difference of the haze.

It is unnecessary to conduct the above Steps S1-S4 continuously. The steps can be one continuous process or individual processes, so long as the haze of the selected wafer corresponding to the two thermal treatments at different time can be detected. Accordingly, a person having ordinary skills in the art understands that the above descriptions does not intend to limit conduction of the steps.

In this Example, in Step S1, the selected wafer can be one or more wafers, and the thermal treatment can include, but not be limited to, bake and the like. The predicted temperature can comprise 1100° C.-1200° C., and plural temperature points can be set in order, for example, the temperature points can be set with a same interval, such as 20° C. Namely, the temperature points are 1120° C., 1140° C., 1160° C. and so forth. A person having ordinary skills in the art can adjust the interval value depending on the actual situations.

While the first thermal treatment is conducted to the selected wafer in the thermal chamber at predicted temperature, the treatment time can be set, for example, but not to be limited, 1-20 minutes. The first thermal treatment can be conducted under plural atmospheres, and the gas can include $H_2/N_2/TCS/Ar$ and the like. Haze value, H1, of the wafer can be detected by a particle measuring apparatus (SP1, SP3, SP5, SP7 and the like) by applying darkfield narrow normal (DNN) channel test. Each haze value corresponds to each specific temperature point. The linear relationship I between the temperature of thermal chamber and the haze of wafer is obtained by fitting the haze values and the corresponding temperature points.

Figure 4:
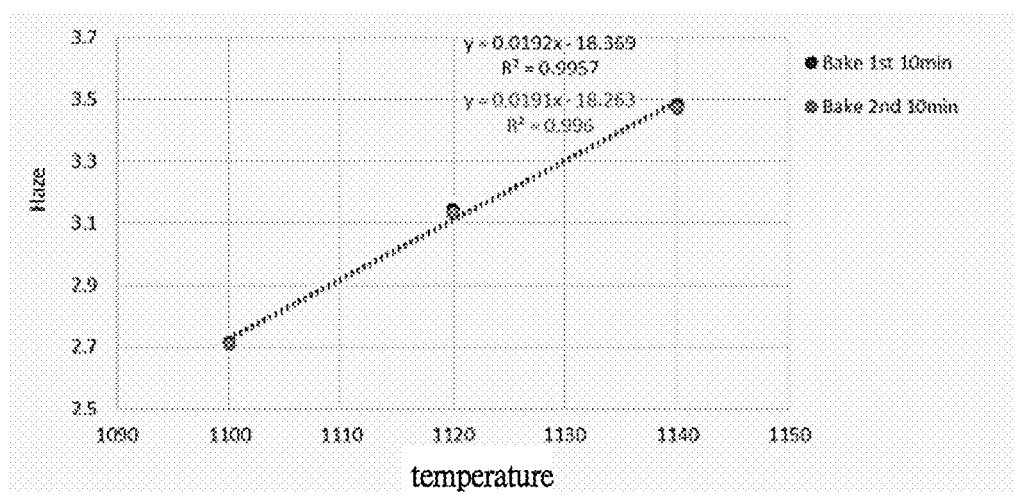
FIG. 4 shows, in accordance with one embodiment of the present application, a linear fitting between temperature and haze.

For example, as shown in FIG. 4, the baking time is 10 minutes. The linear relationship I of the first thermal treatment is obtained by fitting the detected haze values and the corresponding temperature points. The linear relationship I: $Y=0.0192x-18.369$, $R^2=0.9957$, wherein Y is the haze value, x is the corresponding temperature point, and $R^2$ is coefficient of determination. While the coefficient of determination is more closer to 1, the linear fitting is better.

In Step S2, polishing and washing the one or more wafers. The polishing includes, but not be limited to, mechanical polishing or chemical polishing. Other suitable polishing methods known by a person having ordinary skills in the art can be applied to this step. The polishing is to remove the substances formed on the wafer surface after the first thermal treatment. For example, the polishing removes a thickness of 0.1-0.5 μm from the wafer surface. A person having ordinary skills in the art to adjust the removed thickness depending on the needs. The washing is to remove the contaminants such as particles, metal ions and organics on the wafer surface. Specifically, the washing includes, but not be limited to, mechanical washing, wet chemical washing, dry chemical washing and the like. Since the polished and washed wafer can be used repeatedly, the wafer utilization can be increased and the cost can be reduced.

In Step S3, repeating the Step S1 to conduct a second thermal treatment to the polished and washed wafer, and obtaining a linear relationship II between the temperature of the thermal chamber and the haze of the polished and washed wafer.

For example, as shown in FIG. 4, the baking time is 10 minutes. The linear relationship II of the second thermal treatment is obtained by fitting the detected haze values and the corresponding temperature points. The linear relationship II: Y=0.0191x-18.263, $R^2$=0.996, wherein Y is the haze value, x is the corresponding temperature point, and $R^2$ is coefficient of determination. While the coefficient of determination is more closer to 1, the linear fitting is better.

In the Step 4, calculating a difference of the haze at the same temperature point between the Steps S1 and S3. The difference of the haze divided by a linear coefficient makes the actual temperature difference of the thermal chamber. The linear coefficient is selected from that of the linear relationship I or the linear relationship II, provided that the selected linear relationship has the better fitting.

For example, $R^2$ is 0.9957 in the above linear relationship I, $R^2$ is 0.996 in the above linear relationship II. Since the $R^2$ of the linear relationship II is more closer to 1, it is selected to be the divisor to calculate the actual temperature difference of the thermal chamber.

In this example, the Steps S2-S4 can be repeated to detect the temperature of the thermal chamber at more time section. This method is easily to be processed, and the operation efficiency can be increased.

In this example, the Haze difference of the wafer in the same thermal chamber at different time section is applied to detect the temperature of the thermal chamber. It increases efficiency and accuracy of temperature detection of the thermal chamber. Since the uncontrolled temperature difference occurs in the infrared pyrometer and the thermocouple to cause fluctuations of parameters such as wafer thickness and resistivity, the present application can reduce such fluctuations. Moreover, the test wafer can be used repeatedly, so that the wafer utilization can be increased and the cost can be reduced.

Example 2

Figure 5:
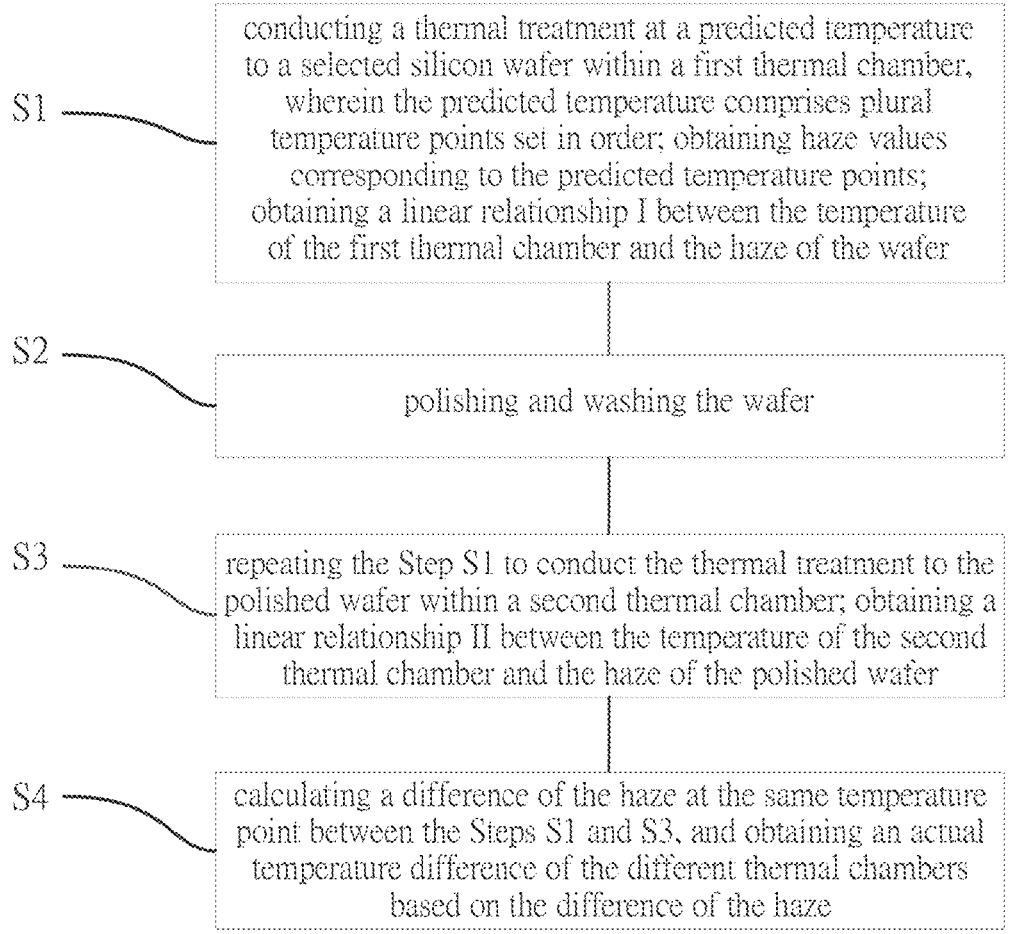
FIG. 5 shows, in accordance with another embodiment of the present application, a flowchart of the method for detecting temperature of a thermal chamber.

Referring FIG. 5, in accordance with another embodiment of the present application, a method for detecting temperature of a thermal chamber is described as follows.

Step S1: conducting a thermal treatment at a predicted temperature to a selected silicon wafer within a first thermal chamber, wherein the predicted temperature comprises plural temperature points set in order; obtaining haze values corresponding to the predicted temperature points; obtaining a linear relationship I between the temperature of the first thermal chamber and the haze of the wafer.

Step S2: polishing and washing the wafer.

Step S3: repeating the Step S1 to conduct the thermal treatment to the polished and washed wafer within a second thermal chamber; obtaining a linear relationship II between the temperature of the second thermal chamber and the haze of the polished and washed wafer.

Step S4: calculating a difference of the haze at the same temperature point between the Steps S1 and S3, and obtaining an actual temperature difference of the different thermal chambers based on the difference of the haze.

This example differs from Example 1 in that Step S1 and Step S3 is respectively conducted in the first thermal chamber and the second thermal chamber. The remaining steps and practices can refers to Example 1. All technical contents described in Example 1 can be applied to Example 2.

In Example 2, the Steps S2-S4 can be repeated to detect the temperature of different thermal chambers. This method is easily to be processed, and the operation efficiency can be increased.

In Example 2, the actual temperature difference of the different thermal chambers can be obtained. The Haze difference of the wafer in different thermal chambers at different time section is applied to detect the temperature of the thermal chamber. It increases efficiency and accuracy of temperature detection of the thermal chamber. Since the uncontrolled temperature difference occurs in the infrared pyrometer and the thermocouple to cause fluctuations of parameters such as wafer thickness and resistivity, the present application can reduce such fluctuations. Moreover, the test wafer can be used repeatedly, so that the wafer utilization can be increased and the cost can be reduced.

Those skilled in the art can recognize that the illustrative units or algorithm steps in the above described embodiments can be implemented by hardware, or software, or a combination of hardware and software. The implementation by hardware or software depends on specific application of technical solution and design constraints. Those skilled in the art can implement the described function by applying various means to various specific applications. Such implementation should not be considered to extend beyond the scope of this invention.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

One of ordinary skill in the art will also understand that multiple ones of the above described modules/units may be combined as one module/unit, each of the above described modules/units may be further divided into a plurality of sub-modules/sub-units, some of the above described modules/units may be ignored or not implemented.

It should be appreciated that to simplify the present disclosure and help to understand one or more of the inventive aspects, in the foregoing descriptions of the exemplary embodiments of the present disclosure, features of the present disclosure are sometimes grouped into a single embodiment or figure, or descriptions thereof. However, the methods in the present disclosure should not be construed as reflecting the following intention: that is, the present disclosure claimed to be protected is required to have more features than those clearly set forth in each claim. Or rather, as reflected in the following claims, the inventive aspects aim to be fewer than all features of a single embodiment disclosed above.

Those persons skilled in the art may understand that, unless at least some of such features and/or processes or units are mutually exclusive, all features disclosed in this specification (including the accompanying claims, abstract, and drawings) and all processes or units in any disclosed method or device may be combined by using any combination. Unless otherwise definitely stated, each feature disclosed in this specification (including the accompanying claims, abstract, and drawings) may be replaced with a replacement feature providing a same, an equivalent, or a similar objective.

In addition, a person skilled in the art may understand that although some embodiments described herein include some features included in other embodiments instead of other features, a combination of features in different embodiments means that the combination falls within the scope of the present disclosure and forms a different embodiment. For example, in the following claims, any one of the embodiments claimed to be protected may be used by using any combination manner.

The component embodiments of the present disclosure may be implemented by using hardware, may be implemented by using software modules running on one or more processors, or may be implemented by using a combination thereof. A person skilled in the art should understand that some or all functions of some or all components according to the invention name of the embodiments of the present disclosure may be implemented by using a microprocessor or a digital signal processor (DSP) in practice. The present disclosure may further be implemented as a device or device program (for example, a computer program and a computer program product) configured to perform some or all of the methods described herein. Such program for implementing the present disclosure may be stored on a computer-readable medium, or may have one or more signal forms. Such signal may be obtained through downloading from an Internet website, may be provided from a carrier signal, or may be provided in any other forms.

The foregoing embodiments are descriptions of the present disclosure instead of a limitation on the present disclosure, and a person skilled in the art may design a replacement embodiment without departing from the scope of the accompanying claims. The word "comprise" does not exclude an element or a step not listed in the claims. The word "a" or "one" located previous to an element does not exclude existence of a plurality of such elements. The present disclosure may be implemented by hardware including several different elements and an appropriately programmed computer. In the unit claims listing several devices, some of the devices may be presented by using the same hardware. Use of the words such as "first", "second", and "third" does not indicate any sequence.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. The scope of the present invention is defined by the appended claims and their equivalent scope.

What is claimed is:

1. A method for detecting temperature of a thermal chamber comprising:
    Step S1: conducting a thermal treatment at a predicted temperature to a selected silicon wafer within the thermal chamber, wherein the predicted temperature comprises plural temperature points set in order; obtaining haze values corresponding to the predicted temperature points; obtaining a linear relationship I between the temperature of the thermal chamber and the haze of the wafer;
    Step S2: polishing and washing the wafer;
    Step S3: repeating the Step S1 to conduct the thermal treatment to the polished wafer within the thermal chamber; obtaining a linear relationship II between the temperature of the thermal chamber and the haze of the polished wafer; and
    Step S4: calculating a difference of the haze at the same temperature point between the Steps S1 and S3, and obtaining an actual temperature difference of the thermal chamber based on the difference of the haze.

2. The method of claim 1, wherein, in the Step 4, the difference of the haze divided by a linear coefficient makes the actual temperature difference of the thermal chamber, wherein the linear coefficient is selected from that of the linear relationship I or the linear relationship II, provided that the coefficient of determination of the selected linear relationship more closes to 1.

3. The method of claim 1, wherein the predicted temperature comprises 1100° C.-1200° C.

4. The method of claim 1, wherein the plural temperature points set in order have an interval of 20° C.

5. The method of claim 1, wherein the haze of the wafer is detected by a particle measuring apparatus.

6. The method of claim 1, wherein the polishing comprises mechanical polishing or chemical polishing.

7. The method of claim 1, wherein the polishing removes a thickness of 0.1-0.5 µm from the wafer surface.

* * * * *